(12) United States Patent
Aizawa

(10) Patent No.: US 6,332,208 B1
(45) Date of Patent: Dec. 18, 2001

(54) DATA TRANSMITTING APPARATUS AND DATA TRANSMITTING METHOD

(75) Inventor: Junichi Aizawa, Yokohama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/207,276

(22) Filed: Dec. 8, 1998

(30) Foreign Application Priority Data

Dec. 12, 1997 (JP) .................................................... 9-362740

(51) Int. Cl.[7] .......................... H03M 13/03; H04L 23/02
(52) U.S. Cl. ..................... 714/786; 375/262; 375/281; 375/331; 375/341
(58) Field of Search ................................. 714/786–792; 375/262, 281, 331, 341; 329/304

(56) References Cited

U.S. PATENT DOCUMENTS 4,908,827 * 3/1990 Gates ..................................... 714/790
5,673,291 * 9/1997 Dent ...................................... 375/262

FOREIGN PATENT DOCUMENTS

| 5-183448 | 7/1993 | (JP) . |
| 7254861 | 10/1995 | (JP) . |
| 9-74404 | 3/1997 | (JP) . |
| 9-172428 | 6/1997 | (JP) . |

OTHER PUBLICATIONS

Article entitled "Am Improved Convolutional Code by Inserting Fixed Bits", by O. Kato et al., published in 1991 Fall Convention of Association of Electronic Communication, p. B–221 (Aug. 15, 1981), with English language translation.
English Language Abstract of JP 5183448.
English Language Abstract of JP 9–74404.
English Language Abstract of JP 9–172428.
An English Language abstract of JP–7–254861.

* cited by examiner

Primary Examiner—Emmanuel L. Moise
(74) Attorney, Agent, or Firm—Greenblum & Bernstein, P.L.C.

(57) ABSTRACT

On a transmitter side, a known bit inserting section 101 inserts a known bit having a predetermined length at a predetermined position of transmitting data, and a tail bit inserting section 102 inserts a tail bit thereto so as to generate frame data. Then, a frame length detecting section 103 detects a length of frame data, a convolutional coding section 104 convolutional codes the frame data, and a dummy bit inserting section 105 inserts a dummy bit to the frame data so as to obtain a transmitting signal. On a receiver side, a decoding section 205 divides a receiving signal into a convolutional coded portion, including a head portion to a tail of a known bit, and a subsequent portion so as to perform decoding on a receiver side. Then, an unnecessary bit removing section 206 removes the known bit, the tail bit, and the dummy bit from the decoded data.

10 Claims, 6 Drawing Sheets

DATA TRANSMITTING APPARATUS AND DATA TRANSMITTING METHOD

BACKGROUND OF THE INVENTION

1. Field of the Invention

The present invention relates to a data transmitting apparatus for convolutional coding data on a transmitter side and for decoding data on a receiver side, and relates to a data transmitting method.

2. Description of the Related Art

In the data communications via a radio communication network, since a bit error frequently occurs, an error correction processing must be performed. As one of error correction methods, there is a method in which coding data obtained by convolutional coding an input bit is decoded by a decoding method on a receiver side.

FIG. 1 is a frame structural view of frame data according to a conventional data transmitting apparatus. In FIG. 1, a tail bit 12 is added to transmitting data 11 for each frame.

FIG. 2 is a frame structural view of data before and after convolutional coding according to the conventional data transmitting apparatus. As shown in FIG. 2, coding data 21 is obtained by convolutional coding frame data obtained by adding the tail bit 12 to transmitting data 11. If a total data length of coding data is below a predetermined frame length, a dummy bit 22 for covering the shortfall is inserted to coding data 21. The transmitter side transmits data having the dummy bit 22 inserted to coding data 21 as a transmitting signal of one unit.

However, in the conventional data transmitting apparatus and data transmitting method, the dummy bit having no information is added to data, which has been convolutional coded. This results in an increase in redundancy, and causes a problem in which a transmission quality cannot be improved.

Moreover, on a receiver side, since the path metric of data, which is used in decoding as a reference, is long, a large number of operations and a large quantity of memory capacity are required. This causes a problem in which the hardware scale of a decoder is increased.

SUMMARY OF THE INVENTION

An object of the present invention is to provide a data transmitting apparatus, which can improve a transmission quality by reducing the number of dummy bit insertions and which can reduce the hardware scale of a decoder by decreasing an amount of processing at a decoding time, and to provide a data transmitting method.

The above object can be attained as follows.

More specifically, on a transmitter side, a known bit is inserted at a predetermined position of transmitting data to perform convolutional coding. On a receiver side, a receiving signal is divided into a convolutional coded portion and a subsequent portion so as to perform decoding.

DETAILED DESCRIPTION OF THE PREFERRED EMBODIMENTS

Embodiments of the present invention will now be specifically described with reference to the drawings.

(First embodiment)

According to the first embodiment of the present invention, a transmitter side inserts a known bit having a predetermined length, which is known to a transmitter side and a receiver side, at a predetermined position of transmitting data. Then, the transmitter side convolutional codes transmitting data having the known bit inserted. A receiver side divides receiving data into a convolutional coded portion, including a head portion to a tail of the known bit, and a subsequent portion to perform decoding.

The first embodiment will be specifically explained with reference to the drawings.

Figure 1:
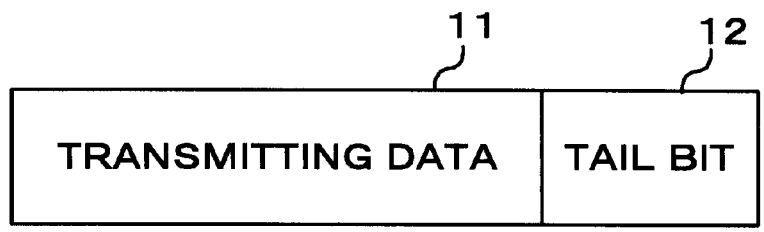
FIG. 1 is a frame structural view of frame data according to a conventional data transmitting apparatus.
Figure 2:
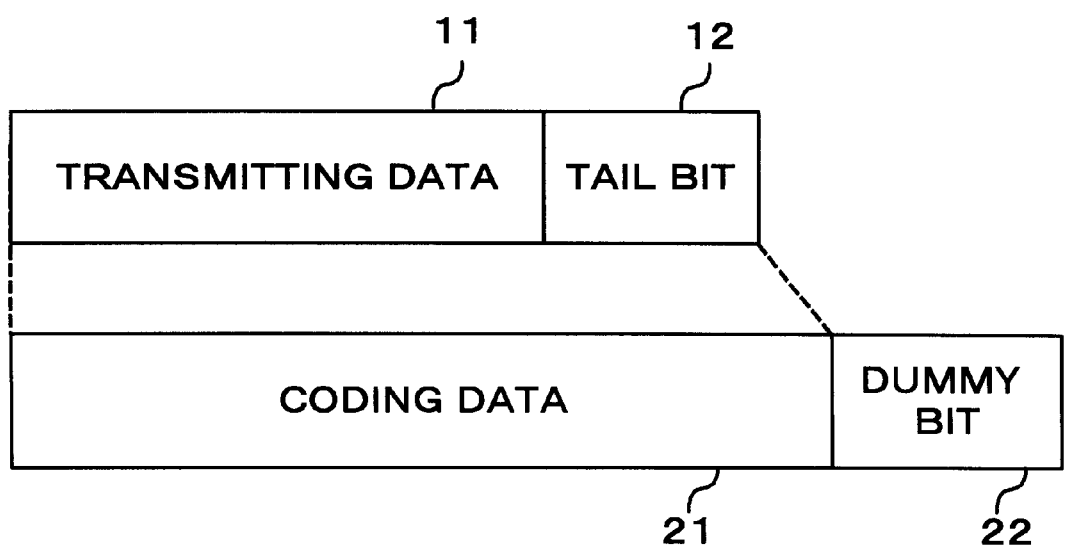
FIG. 2 is a frame structural view of data before and after convolutional coding according to the conventional data transmitting apparatus.
Figure 3:
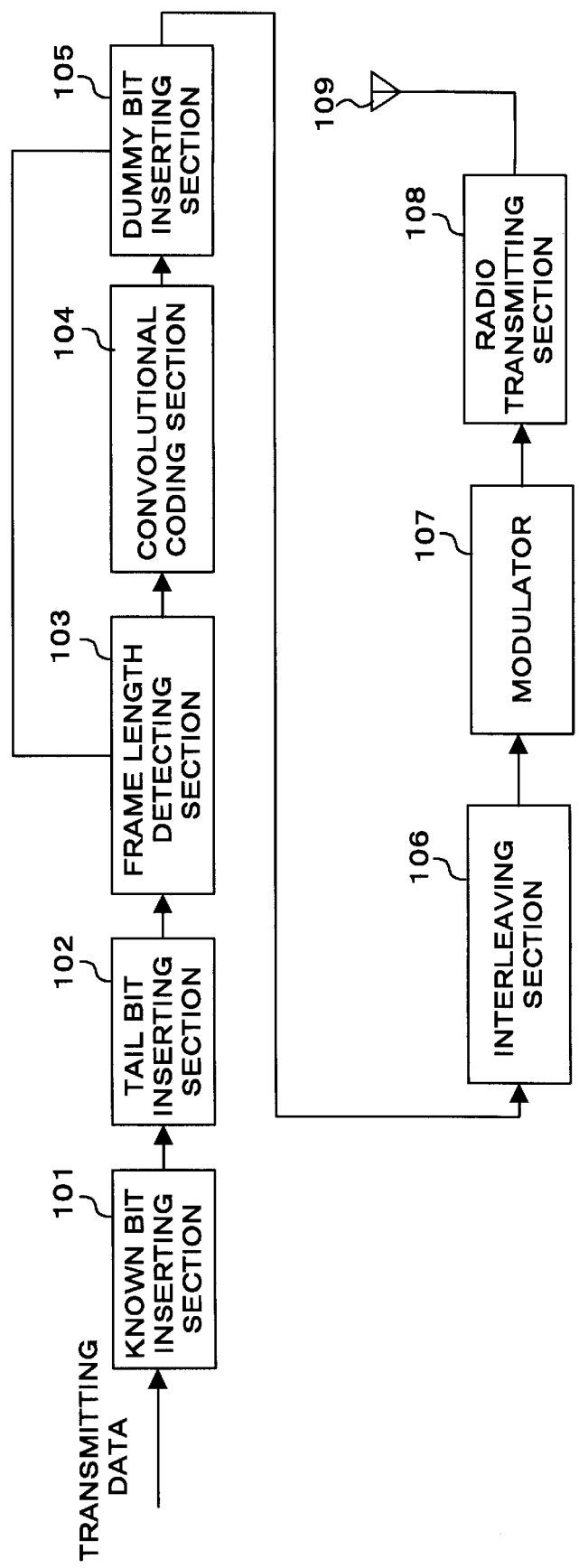
FIG. 3 is a block diagram of a transmitter side of the data transmitting apparatus according to a first embodiment of the present invention.

FIG. 3 is a block diagram of the transmitter side of the data transmitting apparatus according to the first embodiment of the present invention. In FIG. 3, a known bit inserting section 101 inserts a known bit having a predetermined length at a predetermined position of transmitting data. A tail bit inserting section 102 inserts a tail bit to transmitting data having the known bit inserted. Frame data is thus formed.

A frame length detecting section 103 detects a length of frame data, and outputs a detection result to a dummy bit inserting section 105.

A convolutional coding section 104 convolutional codes frame data output from the frame length detecting section 103, and outputs the coded data.

The dummy bit inserting section 105 determines whether or not the coded data is a predetermined frame length based on the detection result of the frame length detecting section 103. If the coded data is the predetermined frame length, the dummy bit inserting section 105 outputs the coded data as a transmitting signal directly. If the coded data is shorter than the predetermined frame length, the dummy bit inserting section 105 outputs a transmitting signal having a dummy bit inserted to the coded data in order to have the predetermined frame length.

An interleaving section 106 provides an interleave processing to the transmitting signal. A modulator 107 provides a primary modulation processing such as QPSK and a secondary modulation such as a spreading processing in a CDMA system to an output signal of the interleaving section 106.

A radio transmitting section 108 frequency modulates an output of the modulator 107 to a radio transmitting frequency, and amplifies the frequency modulated signal. Then, the amplified signal is radio transmitted from a transmitting antenna 109.

Figure 4:
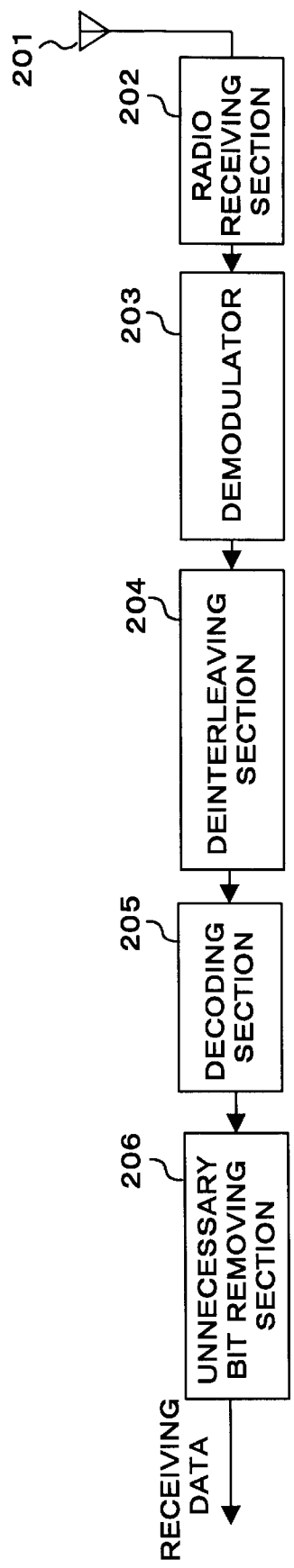
FIG. 4 is a block diagram of a receiver side of the data transmitting apparatus according to the first embodiment of the present invention.

FIG. 4 is a block diagram of the receiver side of the data transmitting apparatus according to the first embodiment of the present invention. In FIG. 4, a radio receiving section 202 amplifies a signal received by a receiving antenna 201 so as to be frequency converted to a baseband.

A demodulator 203 demodulates an output signal of the radio receiving section 202. A deinterleaving section 204 provides a deinterleaving processing to an output of the demodulator 203.

A decoding section 205 decodes the receiving signal subjected to the deinterleaving processing.

An unnecessary bit removing section 206 removes the known bit, the tail bit, and the dummy bit, which have been added by the transmitter side, from decoding data, and outputs receiving data.

Figure 5:
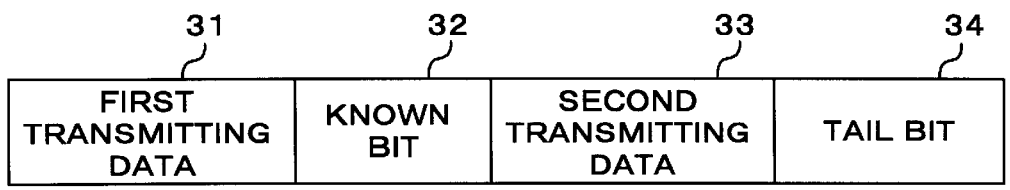
FIG. 5 is a frame structural view of frame data of the data transmitting apparatus according to the first embodiment of the present invention.

FIG. 5 is a frame structural view of frame data of the data transmitting apparatus according to the first embodiment of the present invention. As shown in FIG. 5, transmitting data is divided into first transmitting data 31 and second transmitting data 33 by a known bit 32. As a result, frame data comprises first transmitting data 31, the known bit 32, second transmitting data 33, and a tail bit 34. Note that the known bit insertion position is preferably the intermediate position of transmitting data instead of the head or the end of the frame.

Figure 6:
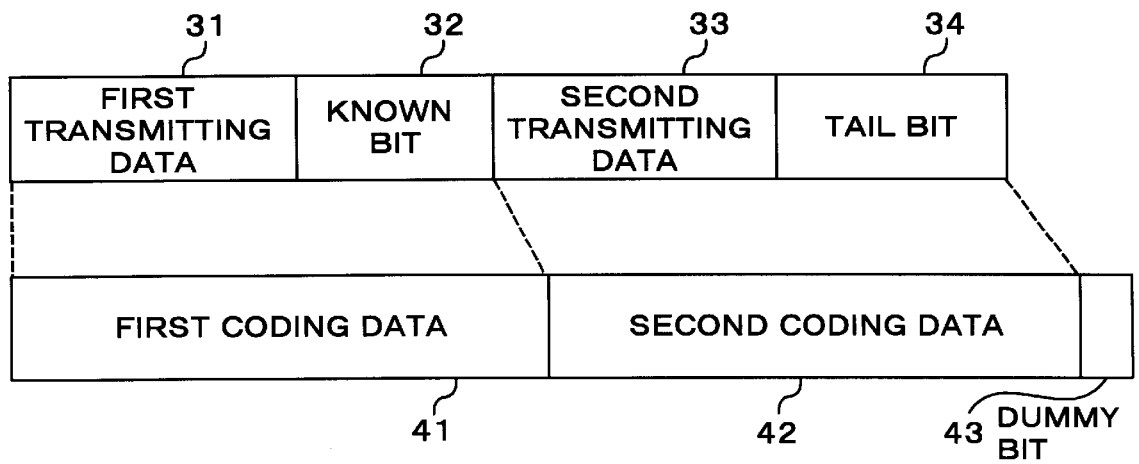
FIG. 6 is a frame structural view of data before and after convolutional coding according to the data transmitting apparatus of the first embodiment of the present invention.

FIG. 6 is a frame structural view before or after convolutional coding according to the data transmitting apparatus the first embodiment of the present invention. As shown in FIG. 6, by convolutional coding frame data, first transmitting data 31 and the known bit 32 serve as first coding data 41 and second transmitting data 32 and a tail bit 34 serve as second coding data 42.

Then, if the total length of which first coding data 41 and second coding data 42 are added is shorter than a predetermined frame length, a dummy bit 43 is inserted after second coding data 42, thereby forming a transmitting signal.

In this case, since the position where the known bit is inserted is known, the receiver side can recognize the tail bit of first coding data in advance, and can once end the decoding at the time when first coding data at the midpoint of the frame is decoded. Then, the receiver side can newly decode second coding data.

Thus, since the data length handling in one decoding processing can be shortened, the amount of data to be once stored in a memory at a decoding time can be decreased, and a memory capacity can be reduced.

It is assumed that the known bit insertion position is set to an intermediate position of each frame. The length of the divided transmitting data is equalized, and the decoding efficiency increases.

Next, the following will explain the flow of the signal to be processed by the data transmitting apparatus according to the first embodiment of the present invention.

First, the known bit inserting section 101 inserts the known bit having the predetermined length at the predetermined position of transmitting data. The tail bit inserting section 102 inserts the tail bit to the tail of transmitting data. Frame data is thus formed. Then, the frame length detecting section 103 detects the length of frame data.

The frame data is convolutional coded by the convolutional coding section 104, and the coded data is output.

Then, if the total length of which coding data is shorter than a predetermined frame length, the dummy bit inserting section 105 inserts a dummy bit after coding data, thereby forming a transmitting signal.

The interleaving section 106 provides the interleave processing to the transmitting signal, and the modulator 107 modulates the transmitting signal. The radio transmitting section 108 frequency converts and amplifies the modulated transmitting signal. Then, the amplified signal is radio transmitted from the antenna 109.

On the receiver side, the signal received by the antenna 201 is first amplified and frequency converted by the radio receiving section 202, and demodulated by the demodulator 203. The demodulated signal is subjected to the deinterleave processing by the deinterleaving section 204.

In the demodulated received signal, first coding data and second coding data are independently decoded by the decoding section 205. Then, the unnecessary bit removing section 206 removes the known bit, the tail bit and the dummy bit, which have been added on the transmitter side, from decoding data, so that receiving data can be extracted.

Thus, by inserting the known bit at the midpoint of transmitting data, the data length handling in one decoding processing can be shortened, the amount of data to be once stored in the memory at the decoding time can be decreased. This results in the reduction of the memory capacity and the miniaturization of a hardware scale.

Moreover, by inserting the known bit at the midpoint of transmitting data, the Insertion quantity of the dummy bits is added to data is reduced. As a result, an increase in redundancy can be restrained, and the transmission quality can be improved.

(Second embodiment)

The second embodiment will explain an example of a cellular phone as a communication terminal apparatus having the data transmitting apparatus of the present invention mounted thereon.

Figure 7:
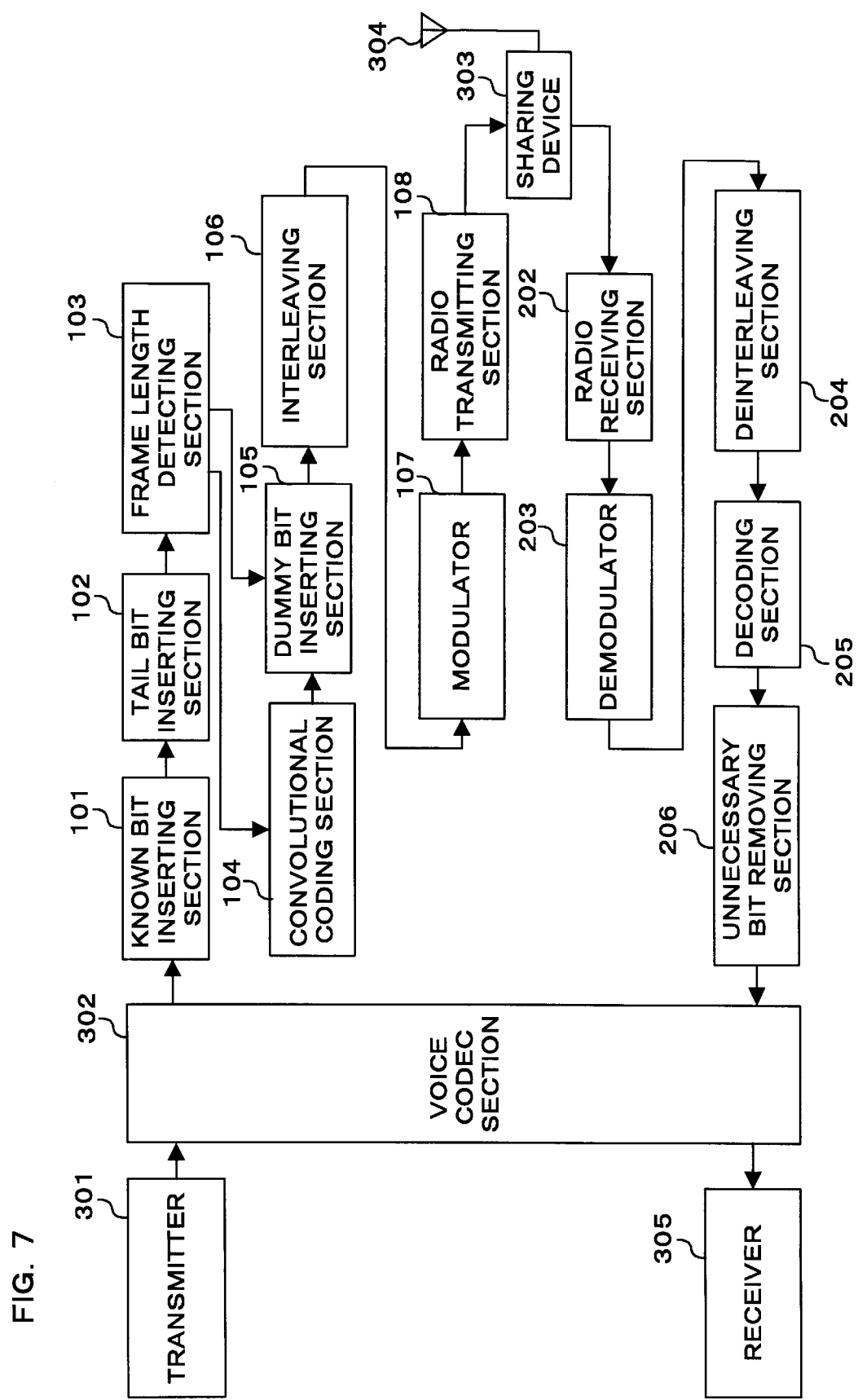
FIG. 7 is a block diagram of a cellular phone according to a second embodiment of the present invention.

FIG. 7 is a block diagram of the cellular phone according to the second embodiment of the present invention. In the cellular phone of FIG. 7, note that the same reference numerals are added to the portions corresponding to the data transmitting apparatus shown in FIGS. 3 and 4, and that the explanation will be omitted.

In the cellular phone of FIG. 7, a transmitter 301 converts an input voice to an electric signal. A voice codec section 302 voice codes the input electric signal and voice decodes the input receiving data. A sharing device 303 is provided to use the same antenna in both the receiving and transmitting. The sharing device 303 outputs the transmitting signal output from the radio transmitting section 108 to an antenna 304. Then, the sharing device 303 outputs the signal radio received by the antenna 101 to the radio receiving section 202. A receiver 305 converts the input electric signal to a voice.

Next, the following will explain the flow of the signal to be processed in the cellular phone according to the second embodiment of the present invention.

The electric signal converted from the voice by the transmitter is voice coded by the voice codec section 302. The signal is output to the known bit inserting section 101 as transmitting data.

The known bit inserting section 101 inserts the known bit having a predetermined length at a predetermined position of transmitting data. Then, the tail bit inserting section 102 inserts the tail bit to the tail of transmitting data. Frame data is thus formed, and the frame length detecting section 103 detects the length of frame data.

The convolutional coding section 104 convolutional codes frame data, and the coded data is output.

Then, if the coded data is shorter than a predetermined frame length, a dummy bit is inserted thereto by the dummy bit inserting section 105. The transmitting signal is thus formed.

The interleaving section 106 provides the interleave processing to the transmitting signal, and the modulator 107 modulates the transmitting signal. The radio transmitting section 108 frequency converts and amplifies the modulated transmitting signal. Then, the amplified signal is radio transmitted from an antenna 304 through the sharing device 303.

On the receiver side, the signal received by the antenna 304 through the sharing device 303 is first amplified and frequency converted by the radio receiving section 202, and demodulated by the demodulator 203. The demodulated signal is subjected to the deinterleave processing by the deinterleaving section 204.

In the demodulated received signal, first coding data and second coding data are independently decoded by the decoding section 205. Then, the unnecessary bit removing section 206 removes the known bit, the tail bit and the dummy bit, which have been added on the transmitter side, from decoding data, so that receiving data can be extracted.

The voice codec 302 voice decodes the receiving data. The receiver 305 converts the coded receiving signal to a voice to be output.

The data transmitting apparatus of the present invention is thus mounted on the communication terminal apparatus, so that the hardware scale of the decoder can be miniaturized. This results in downsizing the communication terminal apparatus.

The second embodiments explained the case in which the cellular phone was used as the communication terminal apparatus. However, the present invention is not limited to the above case. The same effect can be obtained even in the other communication terminal apparatus.

(Third embodiment)

Figure 8:
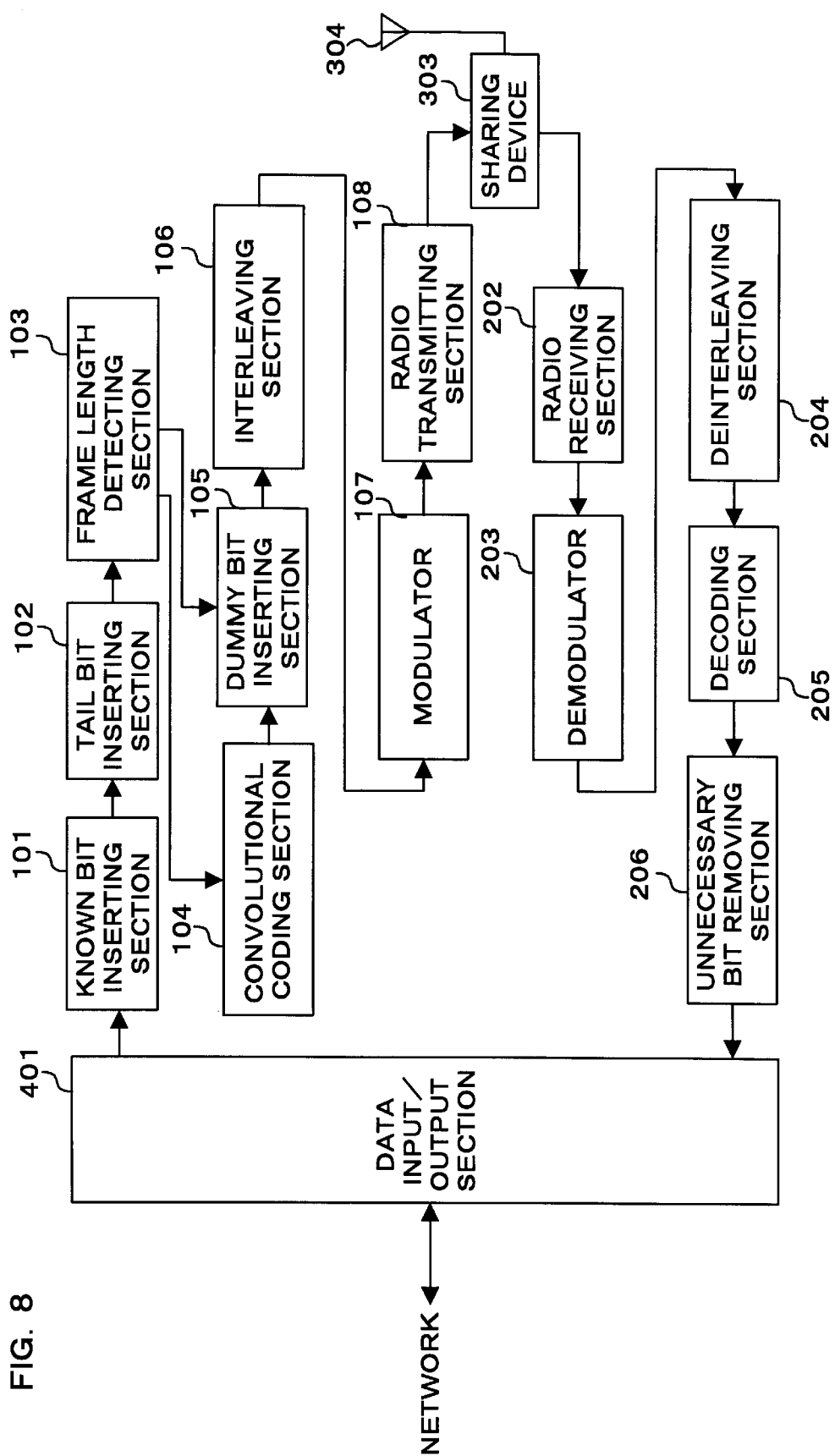
FIG. 8 is a block diagram of a base station according to a third embodiment of the present invention.

FIG. 8 shows a block diagram of a base station apparatus according to the third embodiment of the present invention. In the base station apparatus of FIG. 8, note that the same reference numerals are added to the portions corresponding to the cellular phone shown in FIG. 7, and that the explanation will be omitted.

In the base station apparatus of FIG. 8, a data input/output section 401 is an interface for inputting/outputting a signal from/to a network.

Note that the base station apparatus comprises a plurality of transmitters and receivers such that radio communications with a plurality of communication terminals can be performed simultaneously.

Next, the following will explain the flow of the signal to be processed by the base station apparatus according to the third embodiment of the present invention.

Transmitting data transmitted from the network is output to the known bit inserting section 101 via the data input/output section 401.

The known bit inserting section 101 inserts the known bit having a predetermined length at a predetermined position of transmitting data. Then, the tail bit inserting section 102 inserts the tail bit to the tail of transmitting data. Frame data is thus formed, and the frame length detecting section 103 detects the length of frame data.

The convolutional coding section 104 convolutional codes frame data, and the coded data is output.

Then, if the coded data is shorter than a predetermined frame length, a dummy bit is inserted thereto by the dummy bit inserting section 105. The transmitting signal is thus formed.

The interleaving section 106 provides the interleave processing to the transmitting signal, and the modulator 107 modulates the transmitting signal. The radio transmitting section 108 frequency converts and amplifies the modulated transmitting signal. Then, the amplified signal is radio transmitted from the antenna 304 through the sharing device 303.

On the receiver side, the signal received by the antenna 304 through the sharing device 303 is first amplified and frequency converted by the radio receiving section 202, and demodulated by the demodulator 203. The demodulated signal is subjected to the deinterleave processing by the deinterleaving section 204.

In the demodulated received signal, first coding data and second coding data are independently decoded by the decoding section 205. Then, the unnecessary bit removing section 206 removes the known bit, the tail bit and the dummy bit, which have been added on the transmitter side, from the decoded data, so that receiving data can be extracted.

The receiving data is output to the network via the data input/output section 401.

The data transmitting apparatus of the present invention is thus mounted on the base station apparatus, so that the hardware scale of the decoder can be miniaturized. This results in downsizing the base station apparatus.

The above second and third embodiments explained the case in the data transmitting apparatus of the present invention were mounted on each of the transmitter side and the receiver side. The data transmitting apparatus of the present invention, however, can be used in either the forward link or the reverse link.

As being obvious from the above explanation, according to the data transmitting apparatus of the present invention and its data transmitting method, the insertion quantity of dummy bits is reduced, so that the transmission quality can be improved. Also, the amount of processing at the decoding time is reduced, so that the hardware scale of the decoder can be miniaturized.

This application is based on the Japanese Patent Application No. HEI9-362740 filed on Dec. 12, 1997, entire content of which is expressly incorporated by reference herein.

What is claimed is:

1. A data transmitting apparatus comprising:
    a known bit inserting system that inserts known bit data having a predetermined length at a predetermined position of transmitting data;
    a tail bit inserting system that inserts tail bit data to said transmitting data having said known bit data inserted so as to generate frame data; and
    a coding system that convolutionally codes said frame data.

2. A data transmitting apparatus according to claim 1 comprising:
    a frame length detecting system that detects a length of frame data; and
    a dummy bit inserting system that inserts dummy bit data after convolutional coding if said frame data is shorter than a predetermined length.

3. A communication terminal apparatus, comprising the data transmitting apparatus of claim 1, for radio transmitting convolutionally coded data.

4. A base station apparatus, comprising the data transmitting apparatus of claim 1, for radio transmitting convolutionally coded data.

5. A data transmitting apparatus comprising:
- a decoding system that receives convolutionally coded frame data with known bit data having a predetermined length inserted at a predetermined position within the frame data, tail bit data inserted, and independently decodes a data portion of the frame data and a subsequent portion of the frame data to form decoded data, the data portion being decoded from a head portion of the data portion to a tail of the known bit data; and
- an unnecessary bit removing system that removes the known bit data, the tail bit data, and dummy bit data from the decoded data.

6. A mobile communication terminal apparatus, comprising the data transmitting apparatus of claim 5, for decoding a received radio signal.

7. A base station apparatus, comprising the data transmitting apparatus of claim 5, for decoding a received radio signal.

8. A data transmitting method comprising:
- on a transmitter side,
- inserting tail bit data to transmitting data after inserting known bit data having a predetermined length at a predetermined position of transmitting data so as to generate frame data on a transmitter side; and
- radio transmitting said frame data after performing convolutional coding; and
- on a receiver side,
- independently decoding a data portion of the frame data and a subsequent portion of the frame data to form decoded data, the data portion being decoded from a head portion of the data portion to a tail of the known bit data; and
- removing the known bit data, the tail bit data, and dummy bit data from the decoded data.

9. The data transmitting method according to claim 8, wherein a length of frame data is detected on a transmitter side, and the dummy bit data is inserted after convolutionally coding if said frame data is shorter than a predetermined length.

10. A data receiving apparatus comprising:
- a decoding system that receives frame data transmitted from a data transmitting apparatus according to claim 2, and independently decodes a data portion of the frame data and a subsequent portion of the frame data to form decoded data, the data portion being decoded from a head portion of the data portion to a tail of the known bit data; and
- an unnecessary bit removing system that removes the known bit data, the tail bit data, and the dummy bit data from the decoded data.

* * * * *